United States Patent [19]

Blonder

[11] Patent Number: 5,252,434
[45] Date of Patent: Oct. 12, 1993

[54] METHOD FOR FORMING A SLOPED SURFACE HAVING A PREDETERMINED SLOPE

[75] Inventor: Greg E. Blonder, Summit, N.J.

[73] Assignee: AT&T Bell Laboratories, Murray Hill, N.J.

[21] Appl. No.: 936,051

[22] Filed: Aug. 26, 1992

Related U.S. Application Data

[63] Continuation of Ser. No. 658,145, Feb. 20, 1992, abandoned.

[51] Int. Cl.$^5$ .............................. G03C 5/00; G02B 5/00
[52] U.S. Cl. ...................................... 430/323; 430/325; 430/329; 430/396; 430/313
[58] Field of Search ................... 430/322, 5, 323, 325, 430/329, 396, 311, 313

[56] References Cited

U.S. PATENT DOCUMENTS

| | | | |
|---|---|---|---|
| 4,762,396 | 9/1988 | Dumant | 430/5 |
| 4,912,022 | 3/1990 | Urquhart | 430/322 |
| 5,004,673 | 4/1991 | Vlannes | 430/313 |

Primary Examiner—Marion E. McCamish
Assistant Examiner—Kathleen Duda
Attorney, Agent, or Firm—Glen E. Books

[57] ABSTRACT

In accordance with the invention, a workpiece is provided with a sloped surface of predetermined slope by the steps of: a) coating the workpiece with resist, b) exposing the resist-coated workpiece to activating radiation which varies linearly in the direction of slope, c) developing the exposed resist, and d) etching the resulting structure to form an intaglio pattern in the workpiece surface. In a preferred embodiment, the resist is positive working photoresist and the exposure is through an exposure mask comprising a sequence of triangles having their bases aligned along a line defining the higher edge of a downward sloped region and their apices extending along a line defining the lower edge. After development, the structure is reactively ion etched.

3 Claims, 4 Drawing Sheets

METHOD FOR FORMING A SLOPED SURFACE HAVING A PREDETERMINED SLOPE

This application is a continuation of application Ser. No. 07/658,145, filed on Feb. 20, 1992 now abandoned.

FIELD OF THE INVENTION

This invention relates to photolithography and, in particular, to a method for forming on a workpiece in a single photolithographic operation, one or more sloped surfaces having respective predetermined slopes. The invention can be used to form rings, plateaus, tubs and valleys.

BACKGROUND OF THE INVENTION

Photolithography, the art of using light to transfer an image from a master pattern to another medium, is fundamental in the manufacture of semiconductor and electro-optical devices. In a typical photolithographic operation, a workpiece such as a planar semiconductor substrate is coated with a photosensitive, etch-resistant material called photoresist. The photoresist is then exposed to a pattern of activating radiation by transmitting light through a patterned mask onto the coated surface. After exposure, the resist is developed. If the resist is "positive-working", the exposed resist is washed away. Typically small openings, called windows, are opened in the resist permitting selective treatment, such as etching or doping of the exposed substrate. Thus precise two dimensional patterns can be defined and treated.

Photolithographic etching operations are typically "binary" operations in the sense that they are typically used to either remove a given two dimensional area of a layer or the area is not to be etched. In the usual case a single photolithographic etching step provides only limited ability to shape the topology of a workpiece surface. Significant topology shaping typically requires special etchants and numerous etching steps with different masks.

SUMMARY OF THE INVENTION

Applicant has discovered that by proper design of mask and proper choice of exposure, a photolithographic operation can form a surface having a predetermined slope. In essence, the mask is designed to smoothly and monotonically vary the light intensity in the direction of slope and the intensity of exposure is chosen within a range of values for which the thickness of the developed resist is proportional to exposure.

In a preferred embodiment, the mask provides a smooth, monotonic variation in intensity by providing a sequence of opaque triangles having aligned bases. The amount of light transmitted linearly increases between the aligned bases, where the triangles are close together, to the apices where transmission is essentially unimpeded. By deliberately blurring the projected image of the mask on the substrate during exposure, one obtains a region of monotonically varying resist thickness in the direction between the bases and the apices rather than a binary image of the triangles. More specifically, a workpiece is provided with a sloped surface of predetermined slope by the steps of: a) coating the workpiece with resist, b) exposing the resist-coated workpiece to activating radiation which monotonically varies in the direction of slope, c) developing the exposed resist, and d) etching the resulting structure to form an intaglio pattern in the workpiece surface.

BRIEF DESCRIPTION OF THE DRAWING

The advantages, nature and various additional features of the invention will appear more fully upon consideration of the illustrative embodiments now to be described in detail in connection with the accompanying drawings, in which.

It is to be understood that these drawings are for purposes of illustrating the concepts of the invention. Except for FIGS. 6, 7 and 8, the drawings are not to scale.

DETAILED DESCRIPTION

Figure 1:
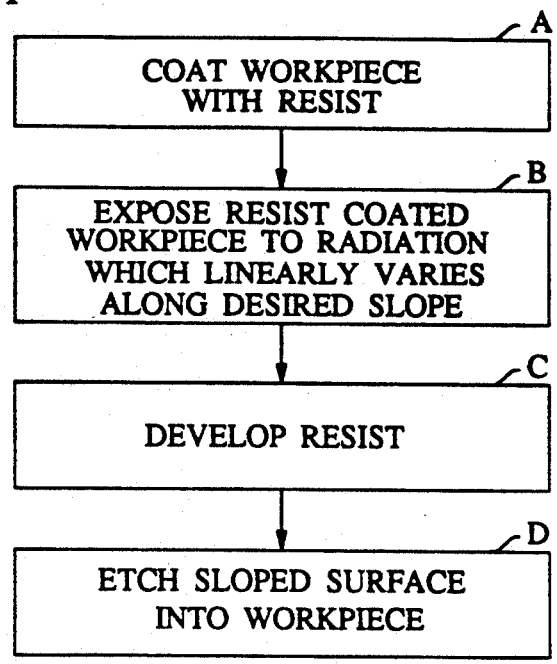
FIG. 1 is a flow diagram showing the steps for providing a workpiece with a plurality of distinctly sloped surfaces in accordance with the invention.
Figure 8:
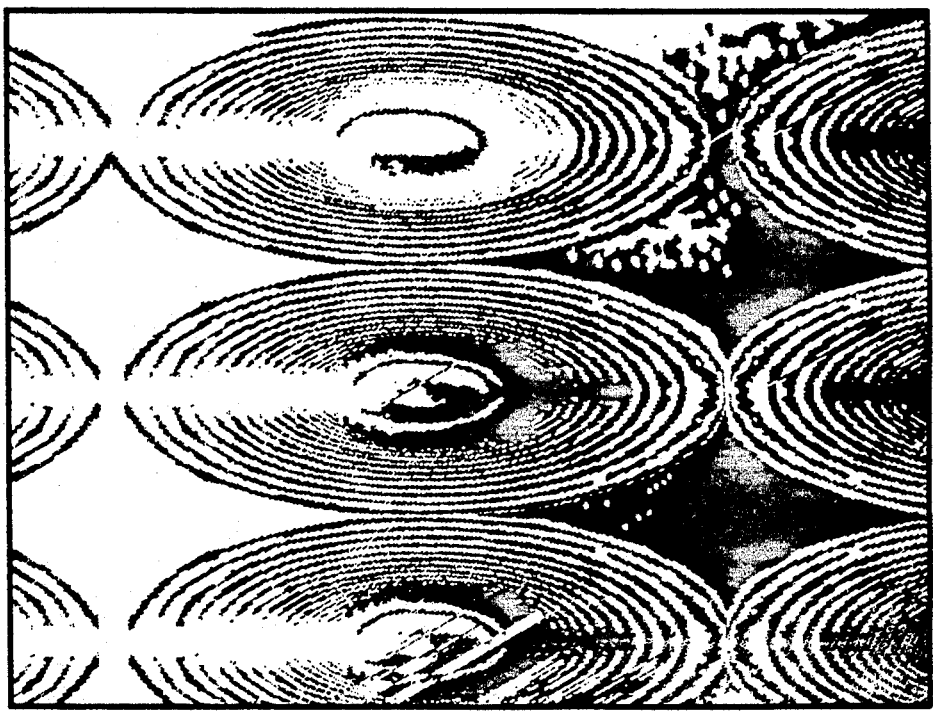
FIG. 8 is a microphotograph of a reflector structure having a plurality of distinctly sloped surfaces made using the method of FIG. 1 and the mask of FIG. 6.

Referring to the drawings, FIG. 1 illustrates the steps for providing a workpiece with sloped surface having a predetermined slope in accordance with one embodiment of the invention, and FIGS. 2–5 schematically illustrate the structures produced at various steps of the process of FIG. 1. The process will be illustrated in the context of forming a concentric ring reflector arrangement with a central lens as depicted in FIG. 8.

Figure 2:
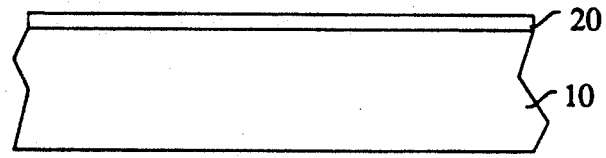
FIGS. 2–5 show schematic cross sections of a workpiece at various steps in the process of FIG. 1.

FIG. 1 Step A shows the first step is coating the workpiece surface to be processed with a thin layer of photoresist. This coating step is conventional and typically involves spin depositing a layer of photoresist on a workpiece. The result, schematically illustrated in FIG. 2, is a workpiece 10 upon which is disposed a photoresist layer 20. In making the reflector structure of FIG. 8 a four micrometer layer of AZ 1400-31 photoresist is spin deposited on a five mil indium phosphide substrate.

Figure 3:
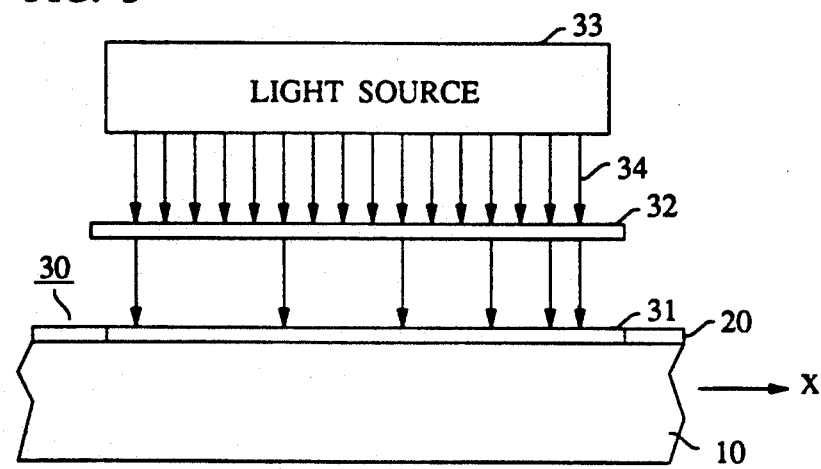

The second step shown in FIG. 1 Step B involves exposing the resist-coated workpiece to activating radiation in a pattern which linearly varies in average intensity from the higher edge of a desired sloped surface to the lower edge. For a positive working resist, the average intensity should be of lowest value along a line 30 along the high edge of the desired slope and greatest along a line 31 at the lower edge. For a negative working resist the average intensity should be greatest at 30 and least at 31. Conveniently such exposure is effected as shown in FIG. 3 by shining ultraviolet light 34 from a source 33 through a transmission mask 32 having a linearly varying transmission pattern in the direction x of greatest slope.

Figure 6:
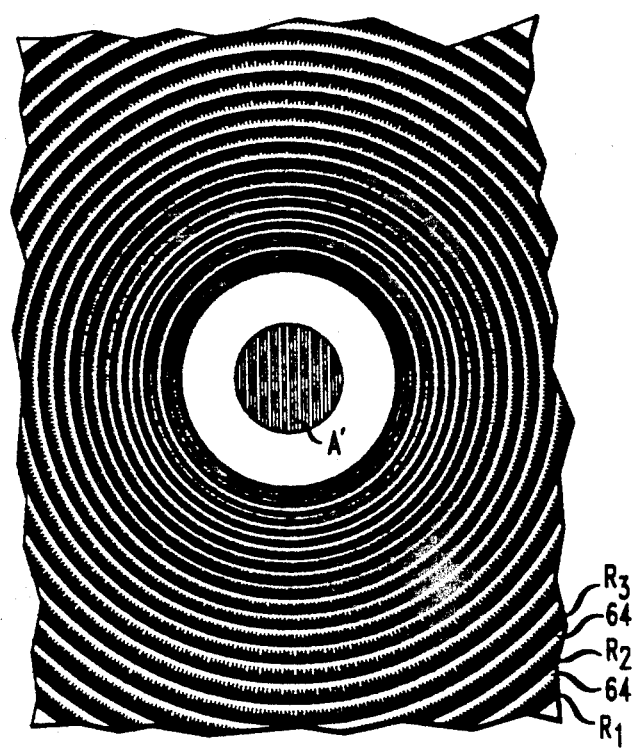
FIG. 6 is a photograph showing the central portion of an exposure mask used in the process of FIG. 1.
Figure 7:
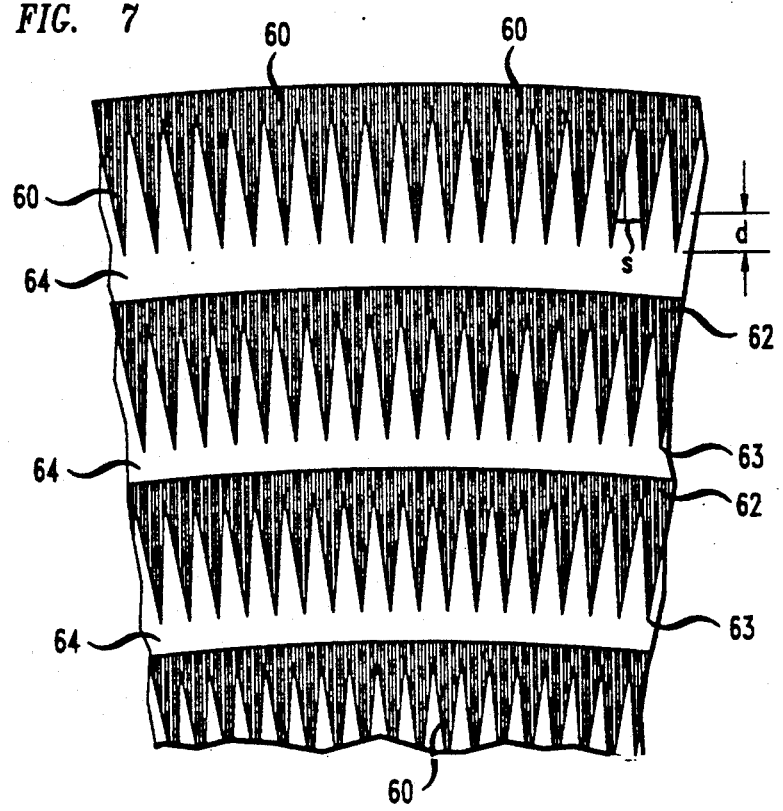
FIG. 7 is an enlarged photograph of a portion of the mask of FIG. 6.

FIGS. 6 and 7 illustrate an exposure mask useful in the process of FIG. 1. FIG. 6 shows the central portion of a mask for etching a series of reflector rings. FIG. 7 is an enlarged portion showing the elements of the mask. In essence, the mask comprises a pattern which permits transmission of a linearly increasing average amount of light as one progresses in the x-direction from the high edge of the proposed sloping surface to the low edge of the surface. The mask of FIG. 6 is designed to produce a plurality of concentric rings comprising gradually sloped regions corresponding to Rings R1, R2, R3 etc. and abrupt reductions in thickness corresponding to open areas 64. Such a mask can conveniently comprise sequential rings of opaque triangular regions 60 of FIG. 7 having aligned bases 62 and aligned apices 63. The average amount of light transmitted through the mask at a given distance d between the bases and the apices is substantially proportional to the separation s between adjacent triangles 60 at distance d. Since the separation s varies linearly with d, the average amount of light transmitted also varies linearly with d. A typical triangular region 60 has a base of about 2.5 micrometers and an altitude of about twenty-seven micrometers. Such a mask is readily fabricated using conventional E-beam patterning equipment such as an EBES Pattern Generator marketed by Perkin-Elmer Corporation.

The manner, intensity and time of exposure are chosen to produce a monotonically varying thickness of developable resist in the direction of desired slope, preferably a linearly varying thickness of resist that can be replicated in the underlying substrate. To achieve this result using the mask of FIGS. 6 and 7, the intensity and time of exposure are chosen lie within the empirically determinable range for which the thickness of the developed resist is proportional to exposure. For the AZ 1400-31 resist used in this example, suitable exposure was for two seconds to a mercury arc lamp in a GCA stepper, Model MANN 4800. Exposure was in a 5:1 reducing stepper. For other resists and light sources, the linear region of exposure can be determined by exposure of a resist coated sample through a wedge neutral density filter. After development, measurement of the resist thickness using conventional instruments such as a Dektak profile measuring instrument will reveal the linear exposure level.

The manner of exposure is chosen to blur any sharp image of the exposure mask and thus produce a sloping surface rather than a sharp image of the mask. One technique for blurring the image uses diffraction. To accomplish diffraction blurring, one uses opaque mask elements that are about one-half the minimum line width for which the exposure system was designed. For example a number of presently available commercial systems have light collimation and lens quality appropriate for one micron design. In such a system, a mask comprised of triangular elements having half-micron bases would be suitably blurred in the direction transverse to the slope gradient. Larger mask elements can be used in the same system by using a reducing stepper. For example, use of a 5:1 reducing stepper would provide blurring of two-and-one half micron mask elements in a one micron exposure system. Alternatively, one can blur the image of the mask elements by placing a diffuser between the light source and the mask. A sheet of 5 mil polytetrafluoroethylene was found to be an especially good diffuser for ultraviolet light.

Figure 4:
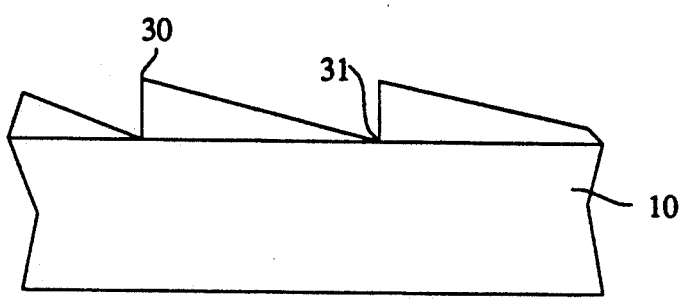
Figure 5:
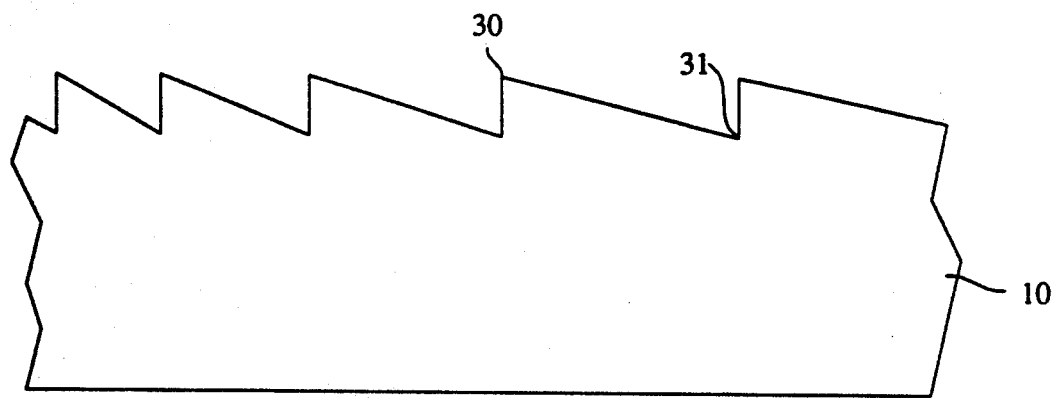

Referring to FIG. 1 step C, the next step after exposure is to develop the exposed resist. The result of such development is a workpiece with an intaglio mask of resist on the surface as schematically shown in FIG. 4. As shown in FIG. 4, with a positive resist, the region of greatest resist thickness (near line 30) corresponds to the region of least exposure and the region of least thickness, the greatest exposure. Advantageously after development the resist is baked in the usual fashion. In making the reflector of FIG. 8, the exposed resist was developed for 30 seconds in Shipley 505 Developer and baked at 90° C. for 30 minutes.

The next step shown in FIG. 1 step D is to etch the masked workpiece to etch away the resist mask and produce in the workpiece surface an intaglio pattern corresponding to the intaglio pattern of the resist. As can be seen from FIG. 5, this pattern correspondence occurs because the thinner regions of resist are etched away first, permitting deeper etching of the workpiece in the underlying regions. Thicker regions of resist protect the workpiece longer resulting in shallower etching of the underlying substrate. In making the structure of FIG. 8 the baked structure was placed in a Plasma Technologies Plasmalab reactive ion etcher with anodized aluminum electrodes. The bottom electrode was maintained at a temperature of 70° C. and was completely covered by a quartz plate thermally bonded to it. After plasma cleaning the chamber with $O_2$, the structure was thermally bonded to the quartz plate by a thin film of diffusion pump fluid. The etcher was then evacuated to $10^{-5}$ Torr and plasma gases consisting of $SiCl_4$ at 10 sccm, $H_2$ at 10 sccm, and $CH_4$ at 1 sccm were flowed through at a total pressure of $1.5 \times 10^{-2}$ Torr. RF power at 13.6 MHz was applied at 180 watts for 60 minutes, giving 300 volts d.c. self-bias.

The result of such etching is a workpiece having a plurality of distinct sloped surfaces. The slopes extend downward from the regions of minimal exposure corresponding to the line of triangle bases to the regions of maximal exposure corresponding to the line of apices. Thus the degree of slope is determined by the etching depth, the relative etch rates of the photoresist and the substrate in the etcher, and the distance between the two regions, which in this embodiment, is the altitude of the triangles comprising mask 32. The resulting structure comprising an indium phosphide workpiece with a plurality of concentric rings is photographically depicted in FIG. 8. This structure, as described in further detail in the co-pending application of G. E. Blonder et al entitled Light Emitting Diode with Multifaceted Reflector to Increase Coupling Efficiency and Alignment Tolerance, filed concurrently herewith, is useful as a reflecting arrangement to increase the amount of light from an underlying LED that can be coupled into an overlying optical fiber.

The invention in its broader aspect is thus a method for providing a workpiece with a sloped surface of predetermined slope. In essence it comprises the steps of: a) coating the workpiece with resist; b) exposing the coated workpiece to activating radiation of intensity which varies linearly in the direction of desired slope; c) developing the exposed resist to produce a pattern of resist which slopes in the desired direction, and d) etching the resulting structure to produce the desired sloped surface in the substrate. The coated workpiece can be exposed to activating radiation by exposure to radiation passing through an exposure mask such as one comprising a plurality of opaque triangular regions having aligned bases and apices.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

I claim:

1. A method for providing a workpiece with a sloped surface of predetermined slope in a predetermined direction comprising the steps of:

coating the workpiece with resist;

exposing the coated workpiece to activating radiation which passes through an exposure mask having a design consisting essentially of opaque triangular sections having aligned bases and aligned apices for causing said radiation intensity to vary linearly in the direction of the predetermined slope;

developing the exposed resist to produce a pattern of resist which slopes in the predetermined direction; and etching the resulting structure to produce the predetermined slope on said workpiece.

2. The method of claim 1 wherein said coated workpiece is exposed to a reduced image of said mask.

3. The method of claim 1 wherein said resist is positive working photoresist activated by ultraviolet light and said coated workpiece is exposed to activating radiation by exposing the workpiece to ultraviolet light passing through an exposure mask comprising a plurality of opaque triangular regions having their bases aligned along a line constituting a high edge of the desired sloped region and having their apices aligned along a line constituting a low edge of said sloped region.

* * * * *